(12) United States Patent
Lenahan et al.

(10) Patent No.: US 12,362,279 B2
(45) Date of Patent: Jul. 15, 2025

(54) SEMICONDUCTING DEVICES, BACK END OF LINE PORTIONS FOR SEMICONDUCTING DEVICES, AND DIELECTRIC MATERIALS INCORPORATING DEUTERIUM

(71) Applicant: The Research Foundation for the State University of New York, Albany, NY (US)

(72) Inventors: Patrick Lenahan, Boalsburg, PA (US); James Lloyd, Katonah, NY (US); Niaz Mahmud, Albany, NY (US)

(73) Assignee: The Research Foundation for the State University of New York, Albany, NY (US)

( * ) Notice: Subject to any disclaimer, the term of this patent is extended or adjusted under 35 U.S.C. 154(b) by 747 days.

(21) Appl. No.: 17/632,487

(22) PCT Filed: Aug. 3, 2020

(86) PCT No.: PCT/US2020/044695
§ 371 (c)(1),
(2) Date: Feb. 2, 2022

(87) PCT Pub. No.: WO2021/026049
PCT Pub. Date: Feb. 11, 2021

(65) Prior Publication Data
US 2022/0285276 A1    Sep. 8, 2022

Related U.S. Application Data

(60) Provisional application No. 62/882,335, filed on Aug. 2, 2019.

(51) Int. Cl.
*H01L 23/522*    (2006.01)
*H01L 23/532*    (2006.01)

(52) U.S. Cl.
CPC ...... *H01L 23/5329* (2013.01); *H01L 23/5226* (2013.01)

(58) Field of Classification Search
CPC .................. H01L 23/5329; H01L 23/5226
See application file for complete search history.

(56) References Cited

U.S. PATENT DOCUMENTS

| | | | |
|---|---|---|---|
| 2015/0021693 A1* | 1/2015 | Javorka | H01L 21/02211 257/288 |
| 2020/0027783 A1* | 1/2020 | Kim | H01L 21/76877 |
| 2021/0035907 A1* | 2/2021 | Chen | H01L 21/76877 |

* cited by examiner

*Primary Examiner* — Eric K Ashbahian
(74) *Attorney, Agent, or Firm* — Lance D. Reich; Peter Fallon

(57) ABSTRACT

Semiconducting devices, and more specifically back end of line (BEOL) portions for semiconducting devices that may include dielectric materials incorporating deuterium are disclosed. The semiconducting devices may include a back end of line (BEOL) portion electrically coupled to a front end of line (FEOL) portion. The BEOL portion may include at least one BEOL level having a dielectric layer. The dielectric layer may include at least one section formed from a low-k material including deuterium (D). The BEOL level(s) may also include an etch stop layer disposed over the dielectric layer, and at least one conductive structure disposed within the dielectric layer. The at least one conductive structure may extend through the dielectric layer and the etch stop layer, respectively.

16 Claims, 10 Drawing Sheets

SEMICONDUCTING DEVICES, BACK END OF LINE PORTIONS FOR SEMICONDUCTING DEVICES, AND DIELECTRIC MATERIALS INCORPORATING DEUTERIUM

CROSS REFERENCE TO RELATED APPLICATIONS

This application claims the benefit of U.S. Provisional Application No. 62/882,335, filed Aug. 2, 2019, which are hereby incorporated herein by reference.

BACKGROUND

The disclosure relates generally to semiconductors, and more particularly, to semiconducting devices, back end of line (BEOL) portions for semiconducting devices, and dielectric materials incorporating deuterium.

Low-dielectric constant ("low-k") dielectrics broadly refer to a class of materials with lower dielectric constants ("k") than that of Silicon Dioxide ("SiO2"), which has a dielectric constant of 4.2. Low-k dielectrics were introduced in the back end of line ("BEOL") in Integrated Circuit ("IC") technology around the turn of the millennium. Low-k dielectrics have a number of advantages, including, but not limited to, lower power consumption and increased switching speeds, compared with the previously used silica-based dielectrics. As the downward scaling of semiconductors has progressed, low-k dielectrics have become increasingly important in the semiconductor industry. This is because low-k dielectrics counteract the increasing resistance-capacitance (RC) delay that manifests as semiconductor size decreases.

However, low-k dielectrics have some notable disadvantages in comparison to silica-based dielectrics. For example, low-k dielectrics have a lower breakdown strength, as well as a larger leakage current through the dielectric. Most saliently, low-k dielectrics cause an increased sensitivity to time dependent dielectric breakdown (TDDB).

Over the years, the TDDB phenomena in BEOL dielectrics has been a significant area of study, wherein several models were proposed to describe the relationship between time to failure (TTF) and electric field or voltage. Presently, there is no consensus on a single correct model. However, research suggest that two of these models—the power law model and the lucky electron model—comport with long term test data better than other models.

BRIEF DESCRIPTION

A first aspect of the disclosure provides a semiconducting device including: a front end of line (FEOL) portion; and a back end of line (BEOL) portion electrically coupled to the FEOL portion, the BEOL portion including at least one BEOL level having: a dielectric layer, the dielectric layer including at least one section formed from a low-k material including deuterium (D); an etch stop layer disposed over the dielectric layer, and at least one conductive structure disposed within the dielectric layer, the at least one conductive structure extending through the dielectric layer and the etch stop layer, respectively.

A second aspect of the disclosure provides a back end of line (BEOL) portion of a semiconducting device electrically coupled to a front end of line (FEOL) portion of the semiconducting device, the BEOL portion including: a first BEOL level including: a first dielectric layer, a first etch stop layer disposed over the first dielectric layer, and a plurality of first conductive structures disposed within the first dielectric layer, the plurality of first conductive structures extending through the first dielectric layer and the first etch stop layer, respectively; and a second BEOL level formed directly over the first BEOL level, the second BEOL level including: a second dielectric layer, a second etch stop layer disposed over the second dielectric layer, and a plurality of second conductive structures disposed within the second dielectric layer, the plurality of second conductive structures extending through the second dielectric layer and the second etch stop layer, respectively, wherein at least one of the first dielectric layer of the first BEOL level or the second dielectric layer of the second BEOL level is formed from a low-k material including deuterium (D).

A third aspect of the disclosure provides a dielectric material including: a carbon doped oxide material including silicon (Si), carbon (C), oxygen (O), and deuterium (D).

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION OF THE INVENTION

As an initial matter, in order to clearly describe the current disclosure it will become necessary to select certain terminology when referring to and describing relevant machine components within the disclosure. When doing this, if possible, common industry terminology will be used and employed in a manner consistent with its accepted meaning. Unless otherwise stated, such terminology should be given a broad interpretation consistent with the context of the present application and the scope of the appended claims. Those of ordinary skill in the art will appreciate that often a particular component may be referred to using several different or overlapping terms. What may be described herein as being a single part may include and be referenced in another context as consisting of multiple components. Alternatively, what may be described herein as including multiple components may be referred to elsewhere as a single part.

As discussed herein, the disclosure relates generally to semiconductors, and more particularly, to semiconducting devices, back end of line (BEOL) portions for semiconducting devices, and dielectric materials incorporating deuterium.

These and other embodiments are discussed below with reference to FIGS. 1-10. However, those skilled in the art will readily appreciate that the detailed description given herein with respect to these Figures is for explanatory purposes only and should not be construed as limiting.

Figure 1:
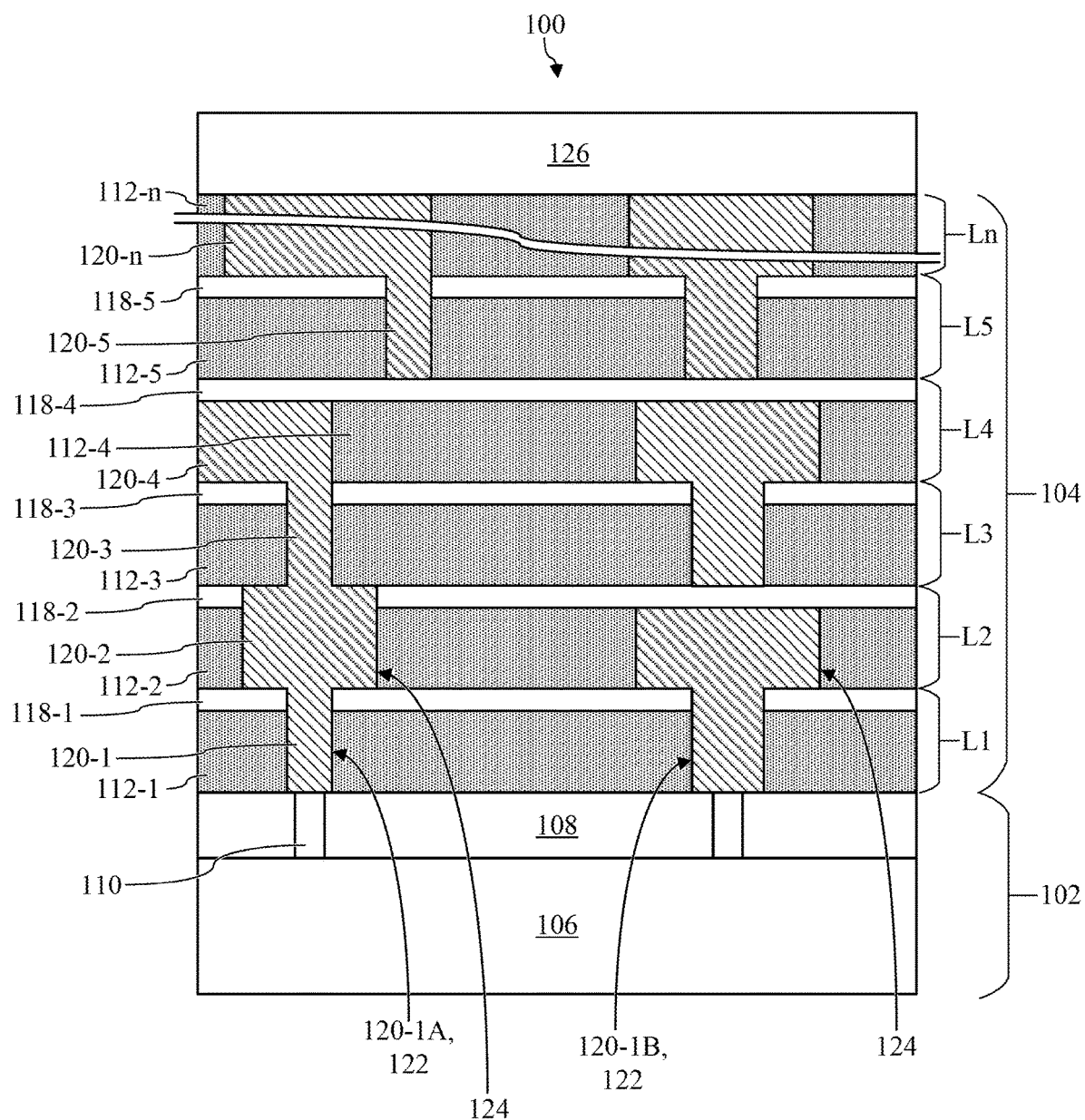
FIG. 1 shows a cross-sectional front view of a semiconducting device including dielectric materials containing deuterium, according to embodiments of the disclosure.

FIG. 1 shows front cross-sectional view of a portion of a semiconducting device 100. Semiconducting device 100 may be formed as any suitable semiconducting device that may be utilized within other electronic devices and/or systems to aid in the operation of the devices and/or systems. For example, semiconducting device 100 may be formed as and/or include a diode, a transistor (e.g., field-effect transistor (FET), metal-oxide-semiconductor FET (MOSFET), spatial wave-function FET (SWSFET), phototransistor, and so on), a photocell, solar cell, or any other suitable semiconductor device that may include and/or utilize the various features discussed herein.

In the non-limiting example shown in FIG. 1, semiconducting device 100 may include a front end of line (FEOL) portion 102 and a back end of line (BEOL) portion 104. BEOL portion 104 may be electrically coupled to FEOL portion 102. More specifically, BEOL portion 104, and at least a portion of the features included therein, may be positioned adjacent to, disposed (directly) over, electrically coupled to, and/or in electrically communication with FEOL portion 102. Electrical coupling between FEOL portion 102 and BEOL portion 104 may allow an electrical signal to pass between and/or from BEOL portion 104 to FEOL portion 102 during the operation of semiconducting device 100.

FEOL portion 102 of semiconducting device 100 may also include a substrate 106. Although shown as only a substrate or single layer of material, substrate 106 of FEOL portion 102 may include represent or include various operational features of FEOL portion 102 and/or semiconducting device 100. That is, and dependent on the type of device semiconducting device 100 is formed as, additional features, components, and/or layers (not shown) may be formed, positioned, disposed, and/or included within/on substrate 106. In a non-limiting example where semiconducting device 100 is formed as a transistor, FEOL portion 102, and more specifically substrate 106, may include a source, a drain, a gate, and so on. Substrate 106 may be formed as a semiconducting material and/or may be formed from any suitable material or material composition that includes semiconducting properties/characteristic. For example, substrate 106 may be formed from indium phosphide (InP) or Indium gallium arsenide (InGaAs). In other non-limiting examples substrate 106 can include without limitation, substances consisting essentially of one or more compound semiconductors. Substrate 106 can be provided as a bulk substrate, as part of a silicon-on-insulator (SOI) wafer, other currently known or later developed materials having similar properties. The additional features included within and/or on substrate 106 (e.g., source, drain, gate, etc.)(not shown) may be formed from any suitable material and may be formed using any suitable semiconductor construction, building, and/or manufacturing technique and/or process.

As shown in FIG. 1, FEOL portion 102 of semiconducting device 100 may also include an insulative layer 108. In the non-limiting example, insulative layer 108 may be positioned on substrate 106. More specifically, insulative layer 108 may be disposed over, may substantially contact, and/or may cover substrate 106, and/or any other features or device positioned within/on substrate 106. Additionally as shown, insulative layer 108 may contact BEOL portion 104, and may be positioned between BEOL portion 104 and substrate 106. In a non-limiting example insulative layer 108 may be formed as a bulk silicon insulator. In other non-limiting examples, insulative layer 108 can be composed of an oxide substance. Materials appropriate for the composition of insulative layer 108 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide (ErOx), and other currently known or later developed materials having similar properties. Insulative layer 108 may be formed and/or disposed over substrate 106 using any suitable material removal and/or deposition process.

FEOL portion 102 of semiconducting device 100 may also include at least one contact 110. In the non-limiting example shown in FIG. 1, contact(s) 110 may extend through insulative layer 108. Contact(s) 110 may be electrically coupled to features (e.g., contact structures adjacent source/gate/drain)(not shown) of FEOL portion 102 that may be included in and/or disposed on substrate 106. Additionally, and as discussed herein, contact(s) of FEOL portion 102 may be electrically coupled and/or in electrical communication with conductive structures of BEOL portion 102 to allow an electrical signal to pass between and/or from BEOL portion 104 to FEOL portion 102 during the operation of semiconducting device 100. In the non-limiting example, contact(s) 110 may be formed from any suitable material that may include conductive properties and/or characteristics. For example, contact(s) 110 may be formed from at least one of gold (Au), aluminum (Al), cooper (Cu), iron (Fe), silver (Ag), or any other suitable material used to form an electrical contact within FEOL portion 102. Contact(s) 110 may also be formed within insulative layer 108 and/or disposed over substrate 106 using any suitable material removal and/or deposition processes.

BEOL portion 104 may also include a plurality of features included and/or formed therein. For example, BEOL portion 104 of semiconducting device 100 may include at least one level (L). More specifically, and as shown in FIG. 1, BEOL portion 104 may include a plurality of distinct levels (L1-Ln), that may include various features, devices, components, layers, and/or materials. The number of levels (L) included in BEOL portion 104 may be dependent, at least in part, on the type of device forming semiconducting device 100, the size/dimensions of BEOL portion 104/semiconducting device 100, operational parameters/characteristics of semiconducting device 100, and so on. In the non-limiting example, BEOL portion 104 of semiconducting device 100 is shown to include six (6) distinct levels (L1, L2, L3, L4, L5, Ln). However it is understood that the number of levels shown are illustrative and non-limiting. As such, BEOL portion 104 of semiconducting device 100 may include more or less levels (L) therein.

Each of the plurality of BEOL levels (L) of BEOL portion 104 may include various layers, features, and/or structures formed or included therein. The layers, features, and/or structures included in each of the plurality of BEOL levels (L) of BEOL portion 104 may aid in the operation of semiconducting device 100 and/or may allow an electrical signal to pass between and/or from BEOL portion 104 to FEOL portion 102. In the non-limiting example shown in FIG. 1, each level (L) of BEOL portion 104 may include a dielectric layer 112. As show, first dielectric layer 112-1 of first level (L1) of BEOL portion 104 may be positioned on and/or disposed directly over insulative layer 108 of FEOL portion 102. Additional dielectric layers 112-2, 112-3, 112-4, 112-5, 112-n for distinct levels (L2, L3, L4, L5, Ln) may be stacked, formed, and/or disposed over first dielectric layer 112-1 of first layer (L1). As discussed herein, each of the dielectric layers 112 found in respective levels (L) of BEOL portion 104 may be separated by etch stop layers of BEOL portion 104.

At least one dielectric layer 112 of BEOL portion 104 for semiconducting device 100 may include at least one section formed from a low-k material including deuterium (D). That is, at least a portion of one or more dielectric layers 112 of BEOL portion 104 may include or be formed from a material that has low-k properties, as well as having a make-up or material composition that includes deuterium (D). In the non-limiting example shown in FIG. 1, each dielectric layer 112 for each level (L) of BEOL portion 104 may be formed from a low-k material including deuterium (D) in its entirety. In other non-limiting examples discussed herein, only a portion of the dielectric layers 112 may be formed entirely from the low-k material including deuterium (D) (see, FIGS. 2-6). In additional non-limiting examples discussed herein, each dielectric layer 112, or alternatively only a portion of the total number of dielectric layers 112, of BEOL line portion 104 may include a portion, a section, and/or a segment of the layer that is formed from the low-k material including deuterium (D). In these non-limiting examples, the remainder or totality of the dielectric layer(s) 112 that is not formed from the low-k material including deuterium (D) may be formed from a distinct dielectric material.

As discussed herein, dielectric layer(s) 112 of BEOL portion 104 may be formed low-k material including deuterium (D). The low-k material used to for dielectric layer(s) 112 may be, for example, a carbon doped oxide dielectric material including silicon (Si), carbon (C), oxygen (O), and deuterium (D) (hereafter, "SiCOD"). In one example, the material may be formed and/or manufactured using the identified elements or compounds above, and may be formed/disposed within BEOL portion 104 using any suitable semiconductor construction, building, and/or manufacturing technique and/or process. In another non-limiting example, SiCOD material forming dielectric layer(s) 112 may be formed by completely removing/replacing hydrogen (H) atoms with deuterium (D) in a carbon doped oxide dielectric material including silicon (Si), carbon (C), oxygen (O), and hydrogen (H) (hereafter, "SiCOH"). That is, hydrogen (H) may be completely removed and replaced with deuterium (D) such that the remaining material (e.g., SiCOD) contains no measurable hydrogen atoms. In this non-limiting example, the hydrogen (H) atoms may be removed and/or replaced with deuterium (D) prior to depositing the material in semiconducting device 100 and/or forming BEOL portion 104.

In another non-limiting example, the low-k material of dielectric layer(s) 112 may be a carbon doped oxide dielectric material including silicon (Si), carbon (C), oxygen (O), hydrogen (H), and deuterium (D) (hereafter, "SiCOHD"). That is, low-k material of dielectric layer(s) 112 may include both hydron (H) and deuterium (D), amongst other elements, to form SiCOHD which includes low-k properties and/or characteristics. In one example, the hydrogen (H) to deuterium (D) ratio is between approximately 1% hydrogen (H) to 99% deuterium (D) to approximately 90% hydrogen (H) to 10% deuterium (D). That is, the total composition of hydrogen (H) and deuterium (D) in the material forming dielectric layer(s) 112 (e.g., SiCOHD) may include between approximately 1% to 90% hydrogen (H), and between approximately 99% to 10% deuterium (D), respectively. More specifically, the hydrogen (H) to deuterium (D) ratio is approximately 50% hydrogen (H) to 50% deuterium (D).

In other non-limiting examples, the low-k material used to form dielectric layer(s) 112 may be any other suitable material(s) that may have a dielectric constant that is approximately 4.0 or below 4.0, and may include deuterium (D). These additional low-k materials may include hydrogen (H) atoms that may be completely removed/replaced, or alternatively partially removed/replaced, as similarly discussed herein with respect to SiCOD or SiCOHD. For example, the low-k material of dielectric layer(s) 112 may be a carbon doped oxide dielectric material including silicon (Si), oxygen (O), carbon (C), nitrogen (N) hydrogen (H), and deuterium (D) (hereafter, "SiOCNHD"). Alternatively, the hydrogen (H) can be completely removed and/or replaced with deuterium (D) in SiOCNH material to form SiOCHD. Additionally, dielectric layers 112 of BEOL portion 104 may be formed and/or disposed over FEOL portion 102 using any suitable material removal and/or deposition process.

In the non-limiting example of FIG. 1, BEOL levels (L1-Ln) may also include an etch stop layer 118. Each etch stop layer 118 formed in each level (L) of BEOL portion 104 may be disposed over a corresponding dielectric layer 112 in the same level (L). For example, a first etch stop layer 118-1 may be disposed (directly) over and/or may substantially cover first dielectric layer 112-1 in the first BEOL level (L1) of BEOL portion 104. Additionally, each etch stop layer 118 may define the end or outer bounds of its corresponding BEOL level (L). As a result, each etch stop layer 118 of one BEOL level (L) may be formed, positioned, and/or disposed directly adjacent to and/or may contact a distinct dielectric layer of a distinct/adjacent BEOL level (L) in BEOL portion 104. For example, and as shown in FIG. 1, in addition to contacting first dielectric layer 112-1, first etch stop layer 118-1 of first BEOL level (L1) may also contact, be disposed, and/or be positioned directly adjacent second dielectric layer 112-2 of second BEOL level (L2). In this non-limiting example, second dielectric layer 112-2 may be disposed, deposited, and/or formed directly over first etch stop layer 118-1. Each etch stop layer 118 may be formed from any suitable material used in semiconductor devices to aid in the formation of BEOL portion 104 of semiconducting device 100. In non-limiting examples, etch stop layer 118 may be formed from nitride, silicon, and/or oxide-based substances or materials. For example, etch stop layer 118 may be formed from silicon nitride (SiN), silicon oxynitride (SiON), silicon carbide (SiC) or silicon carbo nitride (SiCN), silicon dioxide (SiO2), hafnium oxide (HfO2), alumina (Al2O3), yttrium oxide (Y2O3), tantalum oxide (Ta2O5), titanium dioxide (TiO2), praseodymium oxide (Pr2O3), zirconium oxide (ZrO2), erbium oxide (ErOx), and other currently known or later developed materials having similar properties. Etch stop layers 118 may be formed and/or disposed over respective dielectric layers 112 of BEOL portion 104 using any suitable material removal and/or deposition process.

Each BEOL level (L) of BEOL portion 104 may also include at least one conductive structure 120. More specifically, each dielectric layer 112 of BEOL portion 104 may include at least one conductive structure 120 disposed therein. Conductive structure(s) 120 may only be disposed in a portion of each dielectric layer 112 for BEOL portion 104. Additionally, the at least one conductive structure(s) 120 in each BEOL level (L) may extend through dielectric layer 112 and etch stop layer 118, respectively, within the same or corresponding BEOL level (L). For example, and as shown in FIG. 1, first level (L1) of BEOL portion 104 may include a first conductive structure 120-1A, and a second conductive structure 120-1B. Both first conductive structure 120-1A and second conductive structure 120-1B may extend, be disposed, and/or formed through a portion of first dielectric layer 112-1 and first etch stop layer 118-1 of first level (L1). Additionally, second conductive structure 120-1B may extend through first dielectric layer 112-1 and be formed, disposed, and/or positioned adjacent to, as well as, spaced apart from first conductive structure 120-1A. In the non-limiting example, first level (L1) conductive structures 120-1 may also be disposed over, contact, and/or be electrically coupled to corresponding contacts 110 formed in FEOL portion 102 of semiconducting device 100. More specifically, first conductive structure 120-1A may of first level (L1) may contact and be electrically coupled to one contact 110 of FEOL portion 102, while second conductive structure 120-1B may of first level (L1) may contact and be electrically coupled to another, distinct contact 110 of FEOL portion 102.

Each distinct and/or subsequent BEOL level (L) of BEOL portion 104 may also include conductive structures 120 similar to those discussed herein within respect to first BEOL level (L1) conductive structures 120-1A, 120-1B. Each of the distinct/subsequent conductive structures 120-2-120-n may contact and/or be electrically coupled to adjacent conductive structures formed in adjacent or surrounding BEOL levels. For example, and as shown in FIG. 1, second BEOL level (L2) conductive structures 120-2 may be positioned between, may contact, and/or may be electrically coupled to corresponding first BEOL level (L1) conductive structures 120-1, as well as corresponding third BEOL level (L3) conductive structures 120-3. Electrical coupling between the various contacts 110 of FEOL portion 102 and conductive structures 120 in BEOL portion 104 may allow an electrical signal to pass between and/or from BEOL portion 104 to FEOL portion 102 during the operation of semiconducting device 100.

Conductive structures 120 of BEOL portion 104 may be formed as any suitable device, component, and/or feature that may aid in the electrical coupling between FEOL portion 102 and BEOL portion 104, and/or for semiconducting device 100. As shown in FIG. 1, conductive structures 120 may be formed as conductive vias 122, or conductive wires 124. For example, first BEOL level (L1) conductive structures 120-1 may be formed as conductive vias 122, while second BEOL level (L2) conductive structures 120-2 may be formed as conductive wires 124. In the non-limiting example, conductive vias 122 and conductive wires 124 may be formed integral with one another and/or may be electrically coupled to one another within BEOL portion 104. Additionally, a plurality of conductive vias 122 and conductive wires 124 formed throughout the various BEOL levels (L) of BEOL portion 104 may be electrically coupled to one another. In one non-limiting example conductive vias 122 formed in the various BEOL levels (L) may electrically couple various conductive wires 124 within BEOL portion 104, while the conductive wires 124 may be electrically coupled to each other (using vias 122) as well as distinct components, features, and/or devices of semiconducting device 100. Similar to the number of BEOL levels (L), the configuration of conductive structures 120 may be dependent, at least in part, on the type of device forming semiconducting device 100, the size/dimensions of BEOL portion 104/semiconducting device 100, operational parameters/characteristics of semiconducting device 100, and so on. In the non-limiting example, conductive structures 120 of BEOL portion 104 may be formed from any suitable material that may include conductive properties and/or characteristics. For example, conductive structures 120 may be formed from at least one of gold (Au), aluminum (Al), cooper (Cu), iron (Fe), silver (Ag), or any other suitable material used to form an electrical contact within BEOL portion 104. Conductive structures 120 may also be formed within/through dielectric layers 112 and etch stop layers 118 using any suitable material removal and/or deposition processes.

Semiconducting device 100 may also include a passivation layer 126 disposed over BEOL portion 104. More specifically, and as shown in FIG. 1, passivation layer 126 may be disposed over and/or may contact dielectric layer 112-n and conductive structures 120-n of the "nth" BEOL level (Ln) of BEOL portion 104. Passivation layer 126 may contact dielectric layer 112-n and conductive structures 120-n as a result of "nth" BEOL level (Ln) (e.g., top level) not including an etch stop layer. Passivation layer 126 is disposed over and/or contacts certain features of BEOL portion 104 to electrically couple BEOL portion 104 to distinct portions, features, and/or device (not shown) of semiconducting device 100 that are positioned adjacent to and/or above passivation layer 126. In a non-limiting example, passivation layer 126 may include additional features, devices, and/or components, such as a contact pad, seal layer, or a glass layer (not shown), for contacting and electrically coupling additional portions of semiconducting device 100 to BEOL portion 104.

As shown in the non-limiting example, each dielectric layer 112 of BEOL portion 104 may include and/or may be formed from a low-k material having deuterium (D). The inclusion of deuterium (D) in dielectric layers 112 may increase the breakdown strength, and/or decrease leakage within dielectric layers 112. That is, forming dielectric layer(s) 112 to include deuterium (D) may substantially prevent and/or slow down the breakdown of dielectric material during operation of semiconducting device 100. Additionally, or alternatively, deuterium (D) present in dielectric layer(s) 112 of BEOL portion 104 may prevent, eliminate, and/or eliminate leakage within dielectric layers 112 during operation. As a result, the operational life of dielectric layers 112, and in turn semiconducting device 100, may be extended.

Turning to FIGS. 2-10, other non-limiting examples of semiconducting devices 100 are shown. Specifically, FIGS. 2-10 show front cross-sectional views of semiconducting devices 100 including at least one dielectric layer 112 having at least a portion containing or including deuterium (D). It is understood that similarly numbered and/or named components may function in a substantially similar fashion. Redundant explanation of these components has been omitted for clarity.

Figure 2:
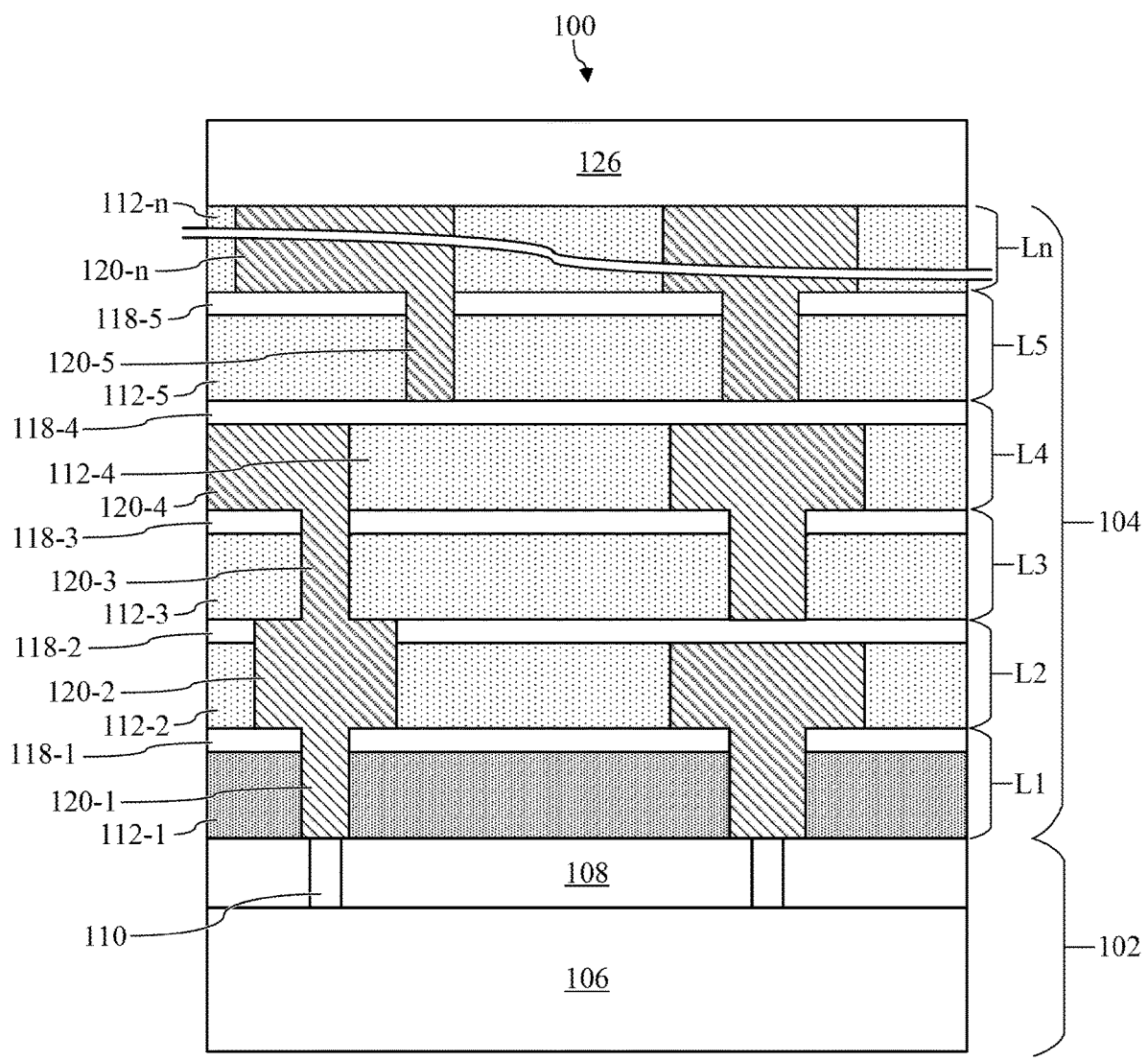
FIG. 2 shows a cross-sectional front view of a semiconducting device including dielectric materials containing deuterium, according to additional embodiments of the disclosure.

In the non-limiting example shown in FIG. 2, only a single BEOL level (L) of BEOL portion 104 may include a dielectric layer 112 including deuterium (D). More specifically, only first BEOL level (L1) may include dielectric layer 112-1 formed from a low-k material that has low-k properties, as well as having a make-up or material composition that includes deuterium (D) (e.g., SiCOD, SiCOHD). As shown in FIG. 2, and as similarly discussed herein with respect to FIG. 1, first BEOL level (L1), and more specifically first dielectric layer 112-1, are positioned directly adjacent FEOL portion 102 of semiconducting device 100.

The remaining BEOL levels (e.g., L2-Ln) of BEOL portion 104 may include dielectric layers 112-2-112-n that are formed from a distinct low-k material. That is, and in the non-limiting example dielectric layers 112-2-112-n formed in second BEOL level (L2) through "nth" BEOL level (Ln) may be formed from distinct low-k materials. The distinct low-k materials may differ from the material forming dielectric layer 112-1 in first BEOL level (L1) in that the distinct low-k materials may not include deuterium (D). In the non-limiting example shown in FIG. 2, as well as FIGS. 3-10, the distinct low-k material may be visually identified by a distinct pattern or hashing configuration that those dielectric layers that include the low-k material including deuterium (D). In non-limiting examples, the distinct low-k material forming dielectric layers 112-2-112-n may include, but are not limited to, SiCOH, fluorinated silicate glass (FSG), carbon doped glass, organo silicate glass (OSG), hydrogen doped glass, porous carbon doped glass, porous silicon dioxide, polymeric dielectrics, F-doped amorphous carbon, silicone based polymeric dielectrics such as hydrogen silsesquioxane (HSQ) methylsilsesquioxane (MSQ), or any other suitable material that may have a dielectric constant that is approximately 4.0 or below 4.0.

As discussed herein, the number of levels of BEOL portion 104 that include dielectric layers 112 formed from a low-k material including deuterium (D) may be one or more levels. The number of levels and/or the specific levels of BEOL portion 104 that may include dielectric layers 112 formed from a low-k material including deuterium (D) may be dependent, at least in part, on properties and/or characteristics of semiconducting device 100. For example, the number of levels (L) and/or the specific levels (L) of BEOL portion 104 that may include dielectric layer 112 formed from a low-k material including deuterium (D) may be dependent on the type of device forming semiconducting device 100, the size/dimensions of BEOL portion 104/ semiconducting device 100, operational parameters/characteristics of semiconducting device 100, and so on. Additionally or alternatively, the number of BEOL levels (L) and/or the specific BEOL level that may include the low-k material including deuterium (D) may be based on predetermined or anticipated areas, positions, and/or locations of BEOL portion 104 that may be more susceptible to leakage and/or breakdown in dielectric layers of BEOL portion 104.

Figure 3:
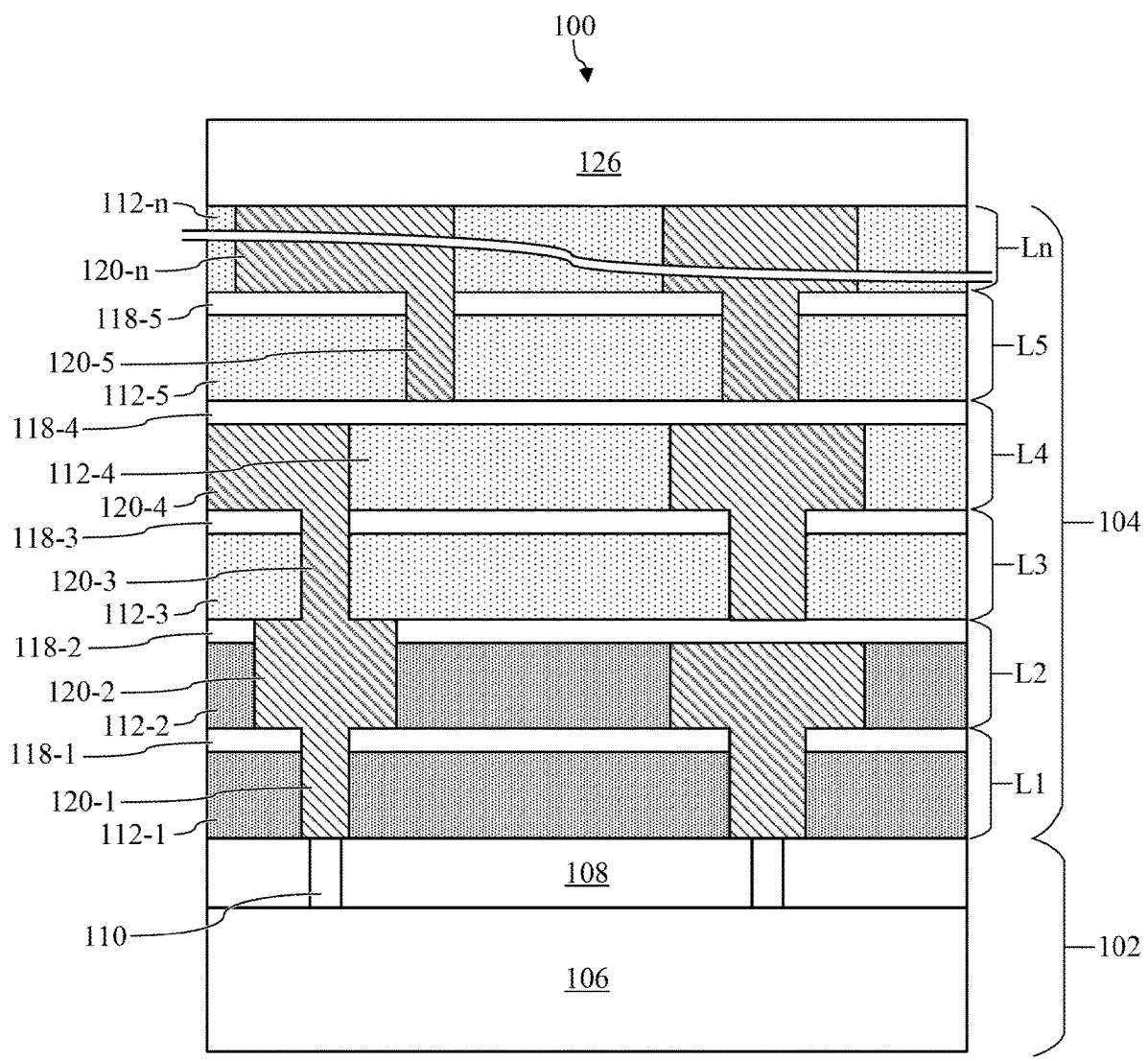
FIG. 3 shows a cross-sectional front view of a semiconducting device including dielectric materials containing deuterium, according to further embodiments of the disclosure.

FIGS. 3-6 show additional non-limiting examples of semiconducting device 100 that includes BEOL portion 104. In the non-limiting examples, some dielectric layers 112 of BEOL portion 104 may be formed from the low-k material including deuterium (D), while other dielectric layers 112 may be formed from low-k materials that do not include deuterium (D). Turning to FIG. 3, first BEOL level (L1) and second BEOL level (L2) may both include dielectric layers 112-1, 112-2 formed from the low-k material including deuterium (D) (e.g., SiCOD, SiCOHD). Additionally, the remaining BEOL levels (e.g., L3-Ln) may include dielectric layers 112-3-112-n formed from the distinct low-k material that may not include deuterium (D).

Figure 4:
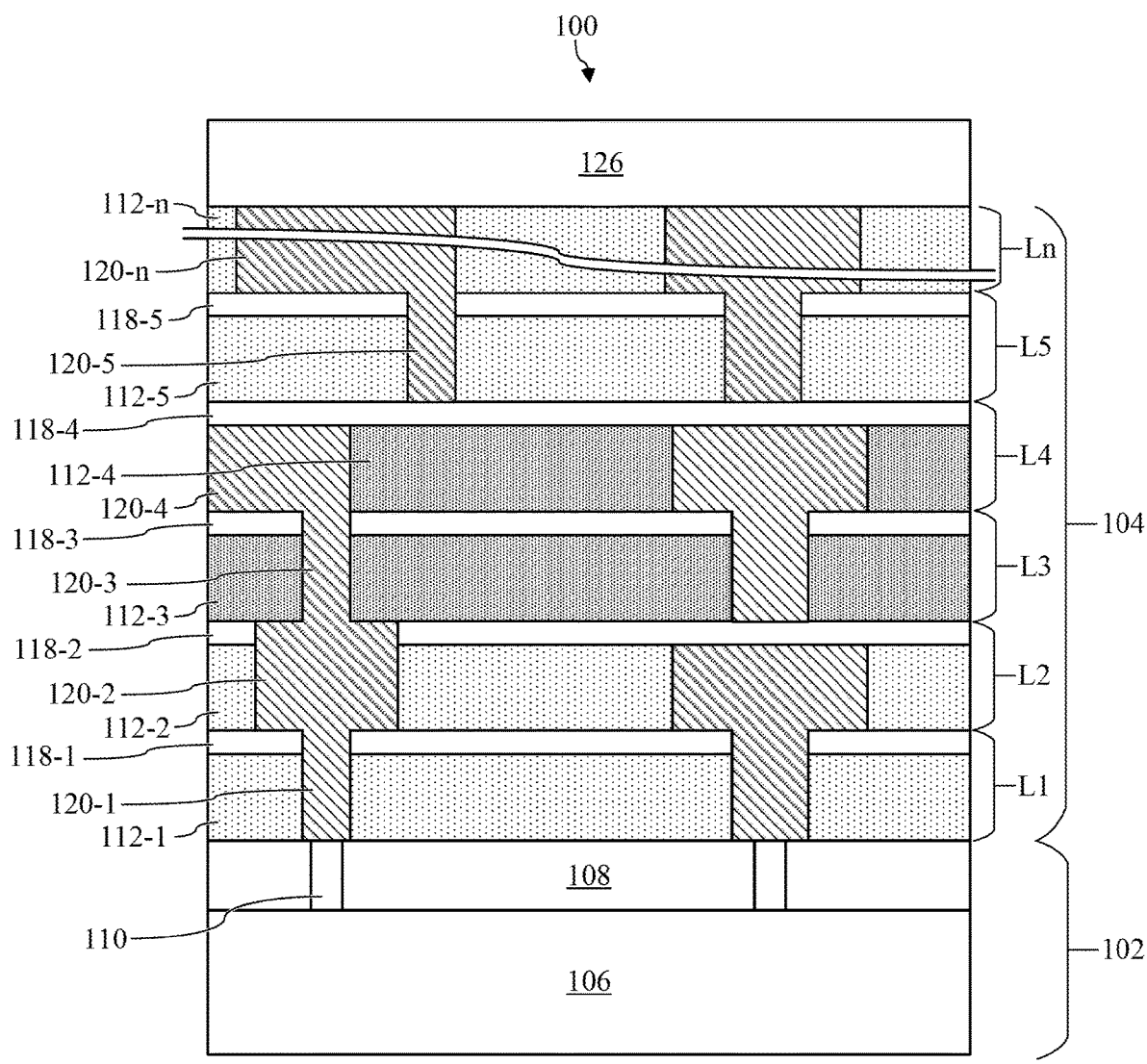
FIG. 4 shows a cross-sectional front view of a semiconducting device including dielectric materials containing deuterium, according to another embodiment of the disclosure.

In the non-limiting example shown in FIG. 4, third BEOL level (L3) and fourth BEOL level (L4) may both include dielectric layers 112-3, 112-4 formed from the low-k material including deuterium (D) (e.g., SiCOD, SiCOHD). The remaining BEOL levels (e.g., L1, L2, L5, Ln) may include dielectric layers 112-1, 112-2, 112-5, 112-n formed from the distinct low-k material that may not include deuterium (D).

Figure 5:
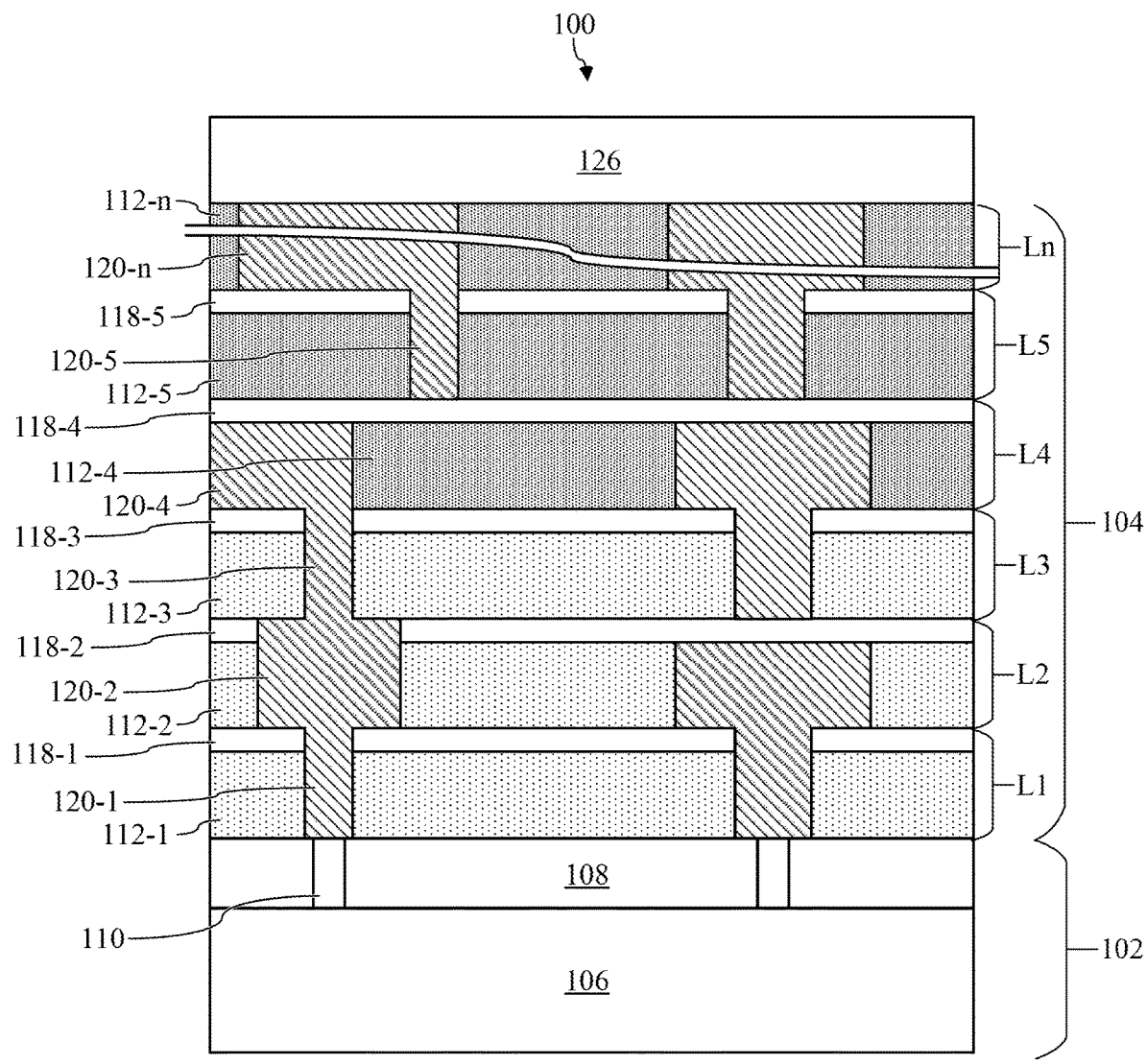
FIG. 5 shows a cross-sectional front view of a semiconducting device including dielectric materials containing deuterium, according to other embodiments of the disclosure.

FIG. 5 shows fourth BEOL level (L4), fifth BEOL level (L5), and "nth" BEOL level (Ln) may including dielectric layers 112-3, 112-4 that may be formed from the low-k material including deuterium (D) (e.g., SiCOD, SiCOHD). The remaining BEOL levels (e.g., L1, L2, L3) may include dielectric layers 112-1, 112-2, 112-3 formed from the distinct low-k material that may not include deuterium (D).

Figure 6:
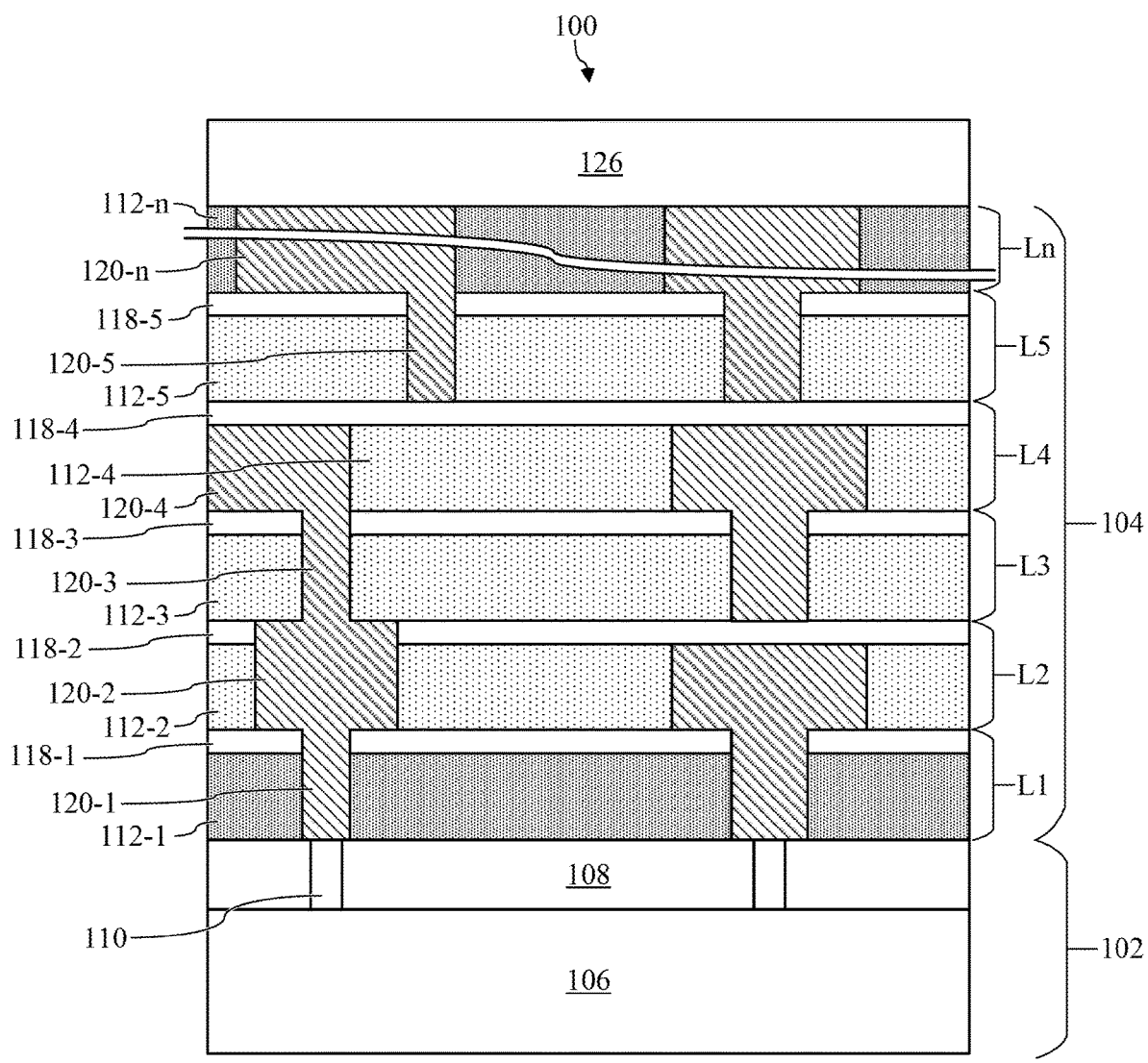
FIG. 6 shows a cross-sectional front view of a semiconducting device including dielectric materials containing deuterium, according to embodiments of the disclosure.

In the non-limiting example shown in FIG. 6, first BEOL level (L1) and "nth" BEOL level (Ln) may both include dielectric layers 112-1, 112-n formed from the low-k material including deuterium (D) (e.g., SiCOD, SiCOHD). In this non-limiting example, dielectric layers 112-1, 112-n positioned directly adjacent and/or contacting FEOL portion 102 and passivation layer 126, respectively, may include the low-k material including deuterium (D). The remaining BEOL levels (e.g., L2, L3, L4, L5) may include dielectric layers 112-1, 112-2, 112-3, 112-4, 112-5 formed from the distinct low-k material that may not include deuterium (D).

Figure 7:
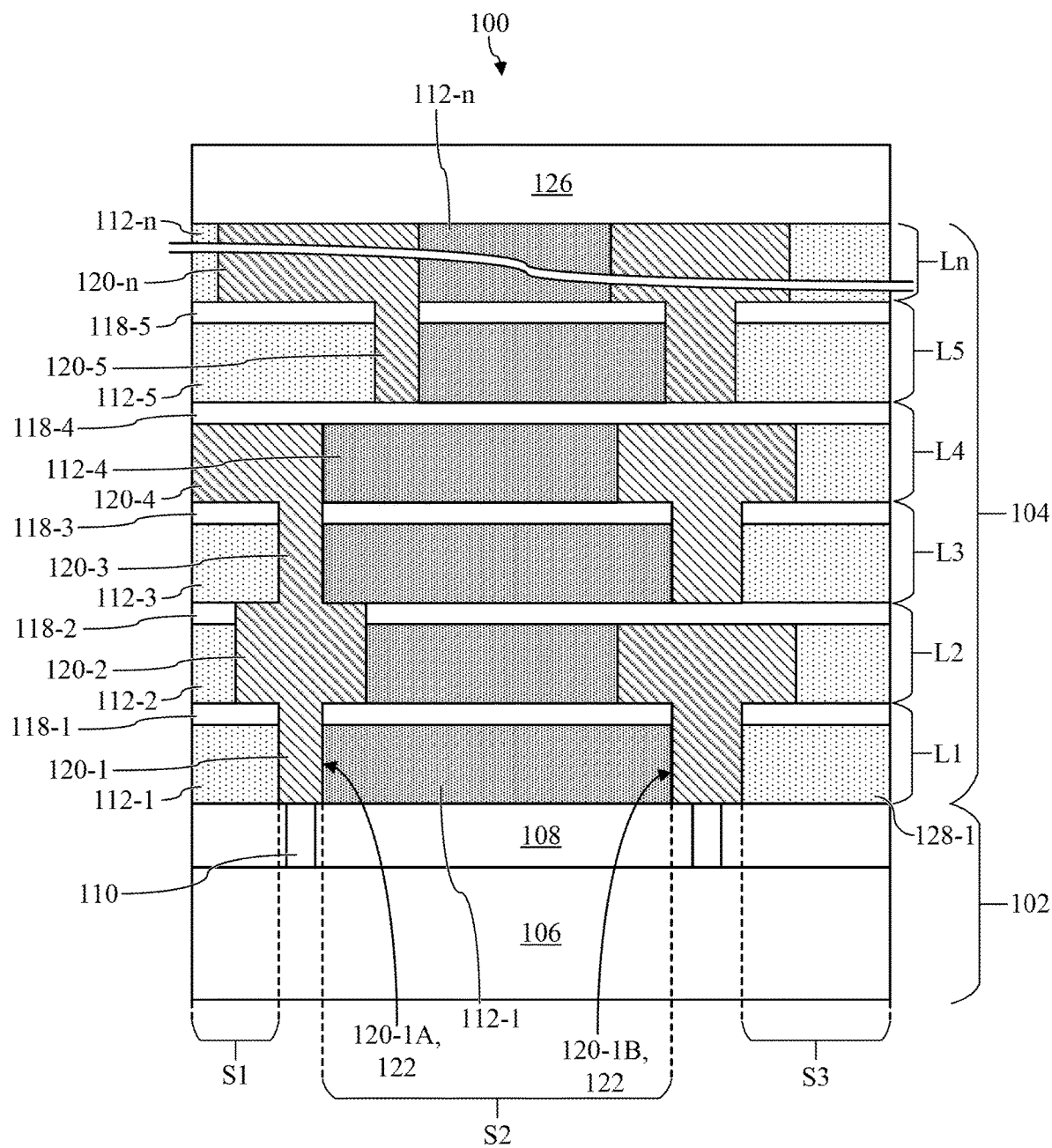
FIG. 7 shows a cross-sectional front view of a semiconducting device including dielectric materials containing deuterium, according to additional embodiments of the disclosure.

Turning to FIG. 7, BEOL portion 104 of semiconducting device 100 may include dielectric layers 112 where only a portion or section of the entire layer is formed from the low-k material including deuterium (D). For example, and with focus on first BEOL level (L1) of BEOL portion 104, a first section (S1), a second section (S2), and a third section (S3) of first dielectric layer 112-1. First section (S1) of first dielectric layer 112-1 may be positioned or located adjacent first conductive structure 120-1A. Additionally, first section (S1) may be formed between an end wall of BEOL portion 104 and first conductive structure 120-1A. In the non-limiting example, first section (S1) of first dielectric layer 112-1 may be formed from the distinct low-k material that does not include deuterium (D). Second section (S2) of first dielectric layer 112-1 may be positioned, formed, and/or located between first conductive structure 120-1A and second conductive structure 120-1B. Second section (S2) of first dielectric layer 112-1 may be formed from the low-k material that does include deuterium (D) (e.g., SiCOD, SiCOHD). Additionally, third section (S3) of first dielectric layer 112-1 may be positioned or located adjacent second conductive structure 120-1B. Third section (S3) may also be formed between an end wall of BEOL portion 104 and second conductive structure 120-1B. In the non-limiting example, and similar to first section (S1), third section (S3) of first dielectric layer 112-1 may be formed from the distinct low-k material that does not include deuterium (D). The additional BEOL levels (e.g., L2-Ln) may include a similar pattern and formation as that discussed herein with respect to first BEOL level (L1).

Figure 8:
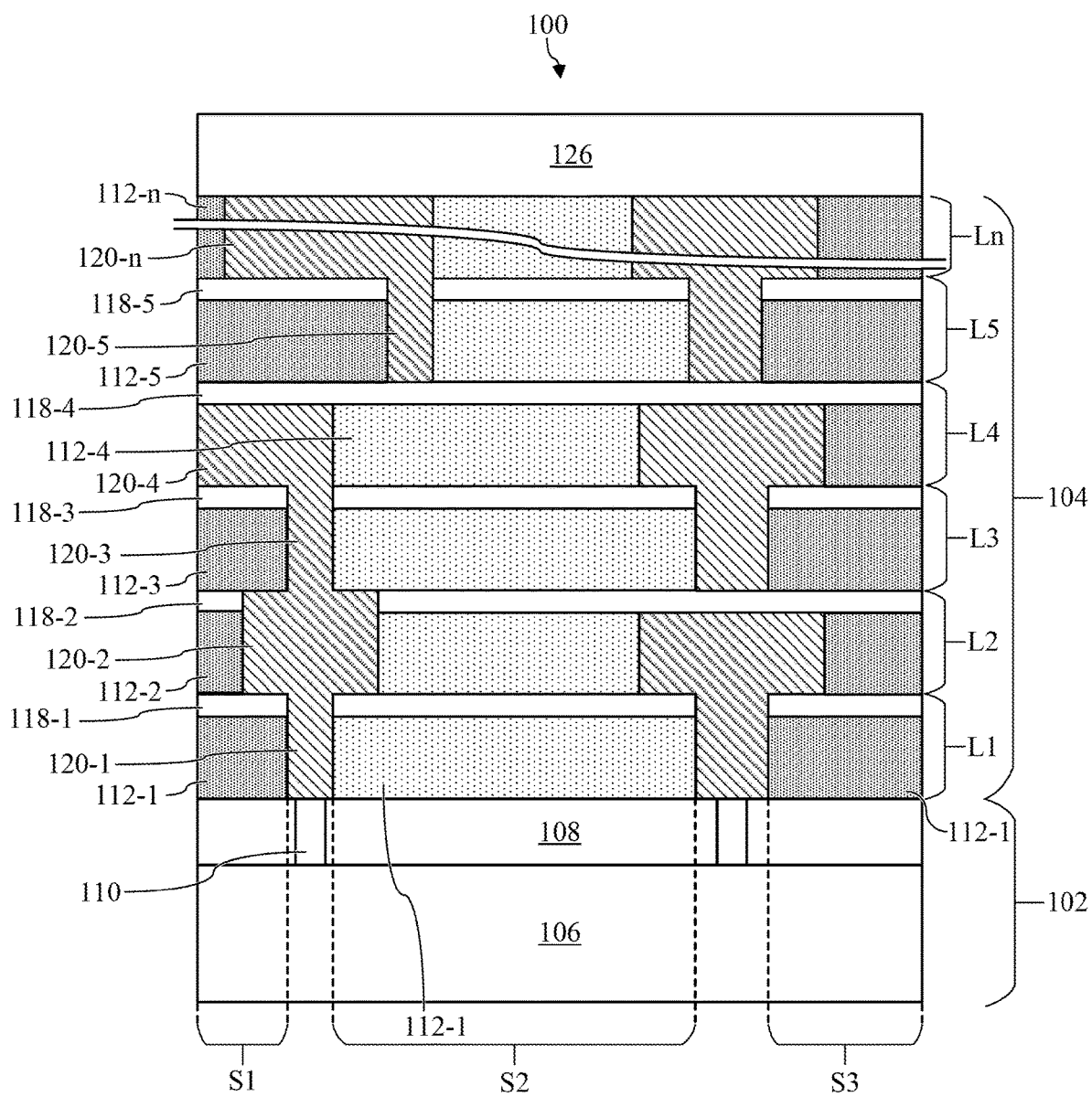
FIG. 8 shows a cross-sectional front view of a semiconducting device including dielectric materials containing deuterium, according to further embodiments of the disclosure.

In the non-limiting example shown in FIG. 8, BEOL portion 104 of semiconducting device 100 may include dielectric layers 112 where only a portion or section of the entire layer is formed from the low-k material including deuterium (D). For example, and with focus on first BEOL level (L1) of BEOL portion 104, first section (S1) and third section (S3) of first dielectric layer 112-1 may each be formed from the distinct low-k material that includes deuterium (D) (e.g., SiCOD, SiCOHD). Additionally, second section (S2) of first dielectric layer 112-1 may be formed from the low-k material that does not include deuterium (D). The additional BEOL levels (e.g., L2-Ln) may include a similar pattern and formation as that discussed herein with respect to first BEOL level (L1).

Although shown as being substantially uniform in pattern and/or formation in FIGS. 7 and 8, it is understood that the patterning and/or formation of the sections in each dielectric layer 112 may be distinct from other dielectric layers 112 within BEOL portion 104 for a single semiconducting device 100. Additionally, and as discussed herein, BEOL portion 104 of semiconducting device 100 may not require that all dielectric layers 112 be either a single material or distinct sections of materials. That is, some dielectric layers 112 may be formed as single material, while other dielectric layers 112 in the same BEOL portion 104 may be formed from various, distinct materials.

Figure 9:
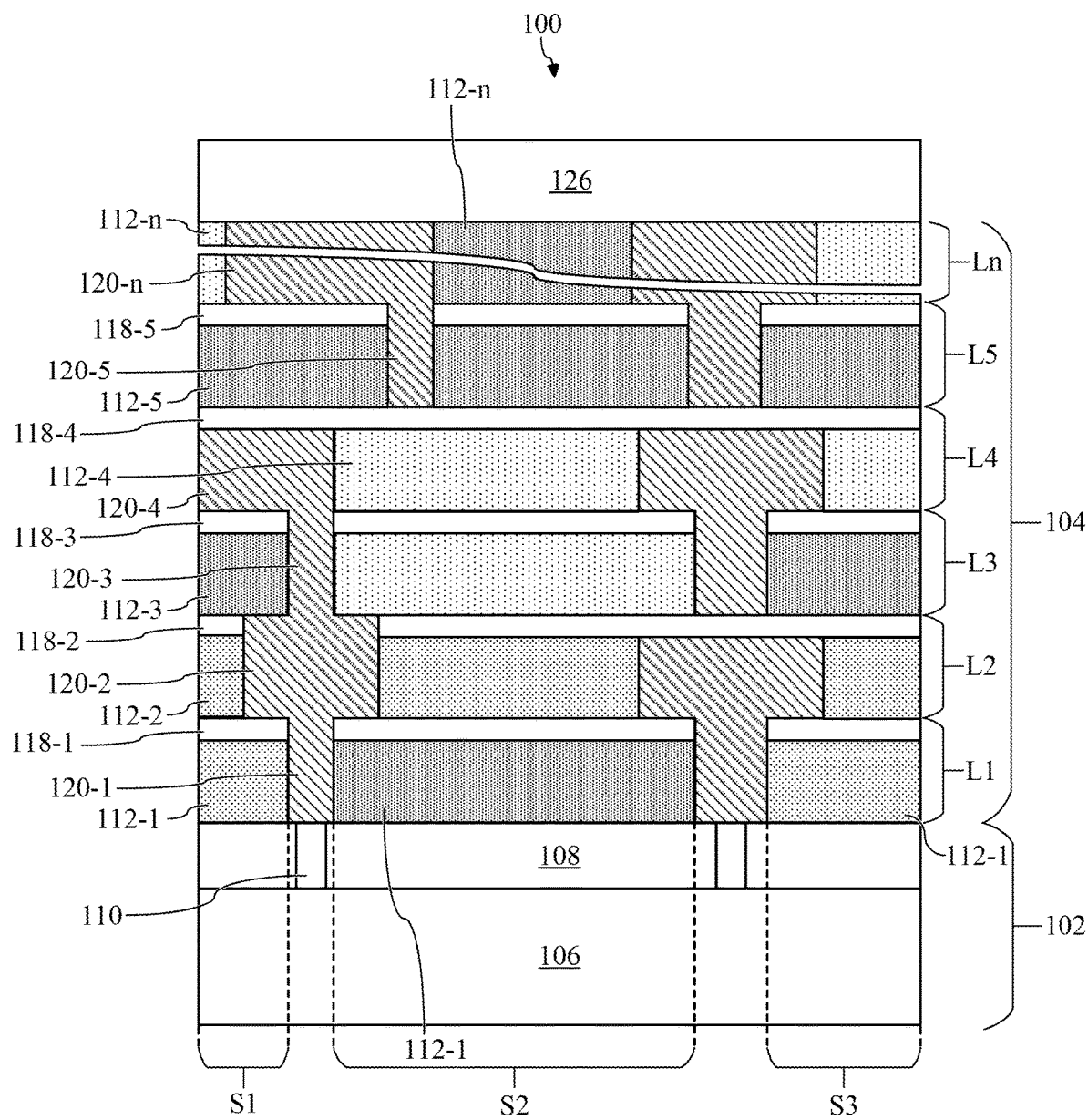
FIG. 9 shows a cross-sectional front view of a semiconducting device including dielectric materials containing deuterium, according to another embodiment of the disclosure.

Turning to FIG. 9, another non-limiting example of semiconducting device 100 is shown. In the non-limiting example, each BEOL level (L) may include a distinct material and/or a distinct configuration or formation for dielectric layers 112 when compared to other dielectric layers 112. With respect to the first BEOL level (L1), and as similarly discussed herein with respect to first dielectric layer 112-1 of FIG. 7, second section (S2) of first dielectric layer 112-1 may be formed from the low-k material including deuterium (D) (e.g., SiCOD, SiCOHD). Additionally as shown in FIG. 9, first section (S1) and third section (S3) may also be formed from a low-k material that includes deuterium (D). However, the low-k material forming first section (S1) and third section (S3) of first dielectric layer 112-1 may be distinct form the low-k material forming second section (S2). For example, the concentration or percentage of deuterium (D) in the distinct low-k material forming first section (S1) and third section (S3) may be distinct from the concentration or percentage of deuterium (D) in the low-k material forming second section (S2). In a non-limiting example, the low-k material forming second section (S2) of first dielectric layer 112-1 may be SiCOD, while the distinct low-k material forming the first section (S1) and third section (S3) of first dielectric layer 112-1 may be SiCOHD.

Second BEOL level (L2) may include second dielectric layer 112-2 that is formed from a single material. For example, second dielectric layer 112-2 may be entirely formed from the distinct low-k material including deuterium (D)—similar to first section (S1) and third section (S3) in BEOL level (L1). In the non-limiting example, third BEOL level (L3) may include a first section (S1) and a third section (S3) of third dielectric layer 112-3 formed from the low-k material that includes deuterium (D), and a second section (S2) of third dielectric layer 112-3 formed from the low-k material that does not include deuterium (D). Fourth BEOL level (L4) may include a fourth dielectric layer 112-4 that may be formed entirely from the low-k material that does not include deuterium (D). Fifth BEOL level (L5) may include a fifth dielectric layer 112-5 that may be formed entirely from the low-k material that includes deuterium (D). Finally, "nth" BEOL level (Ln) may include a first section (S1) and a third section (S3) of nth dielectric layer 112-n formed from the low-k material that may not include deuterium (D), and a second section (S2) of nth dielectric layer 112-n formed from the low-k material that does include deuterium (D). As shown in this example, and as discussed herein, any combination of formations and/or configurations for the material forming dielectric layers 112 of BEOL portion 104 may be included in semiconducting device 100.

Figure 10:
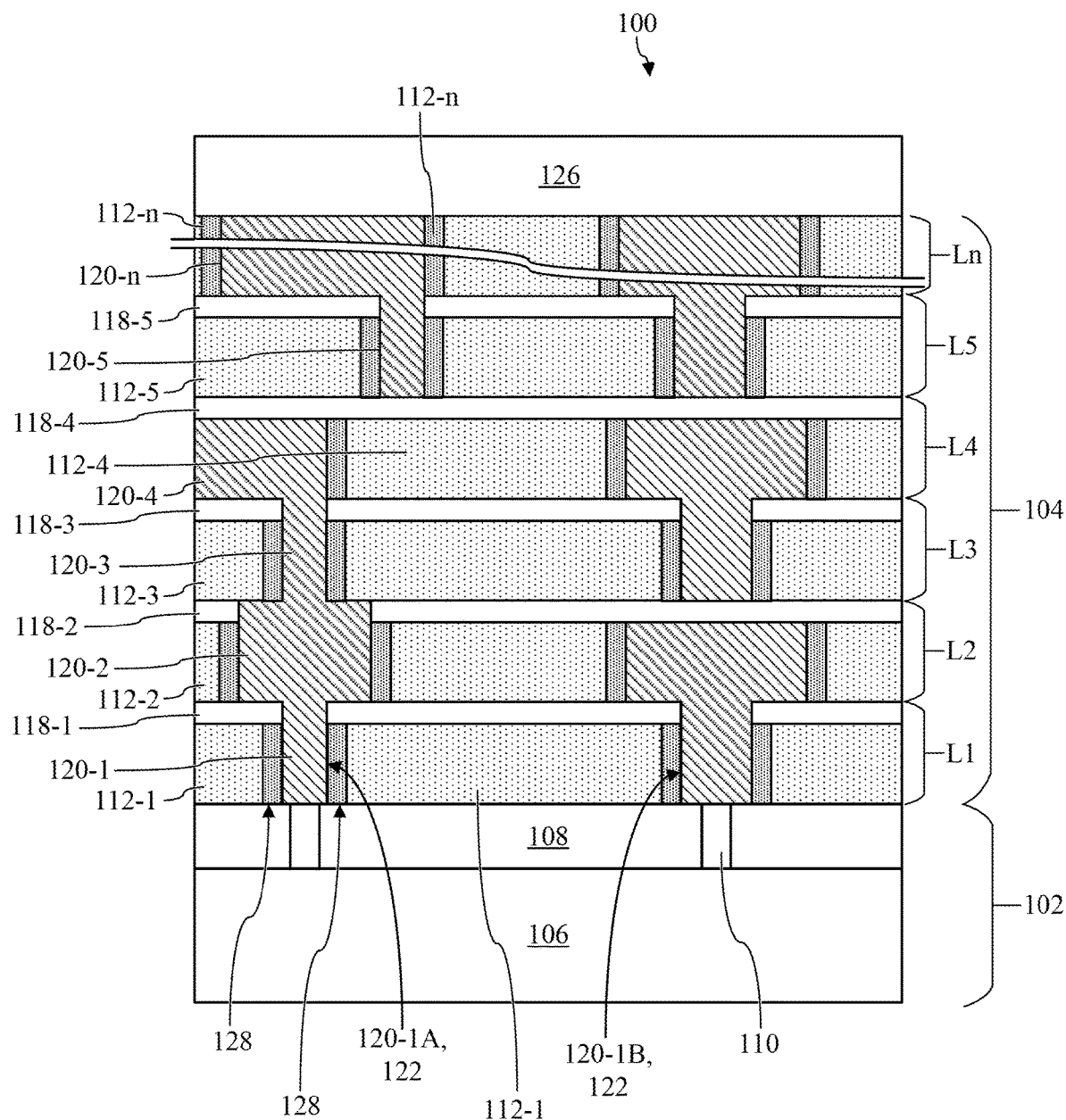
FIG. 10 shows a cross-sectional front view of a semiconducting device including dielectric materials containing deuterium, according to other embodiments of the disclosure.

Turning to FIG. 10, another non-limiting example of semiconducting device 100 is shown. In the non-limiting example, at least one dielectric layer 112 included within BEOL portion 104 may include dielectric barriers 128. Dielectric barriers 128 may be formed, positioned, and/or disposed within dielectric layer 112. Additionally, dielectric barriers 128 may be formed directly adjacent to, may substantially surround, and/or may contact conductive structures 120 of BEOL portion 104. For example, and with focus on first BEOL level (L1) of BEOL portion 104, dielectric barriers 128 may be formed in and/or my extend through first dielectric layer 112-1. Additionally, dielectric barriers 128 may be formed directly adjacent to, may substantially surround, and/or may contact first conductive structure 120-1A, as well as second conductive structure 120-1B. Dielectric barriers 128 may be formed from a low-k material that may include deuterium (D). As discussed herein with respect to some of dielectric layers 112, dielectric barriers 128 may be formed from a low-k material that may include deuterium (D) (e.g., SiCOD, SiCOHD). In the non-limiting example, first dielectric layer 112-1 that may be positioned adjacent to, contact, and/or substantially surround dielectric barrier 128 may be formed from a low-k material that does not include deuterium (D), as similarly discussed herein. In other non-limiting examples (not shown) first dielectric layer 112-1 positioned adjacent to, contacting, and/or substantially surrounding dielectric barrier 128 may be formed from a distinct low-k material that does include deuterium (D), where the deuterium (D) concentration or percentage is distinct from that of the material forming dielectric barrier 128.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A semiconducting device, comprising:
   a front end of line (FEOL) portion; and
   a back end of line (BEOL) portion electrically coupled to the FEOL portion, the BEOL portion including at least one BEOL level having:
      a dielectric layer, the dielectric layer including at least one section formed from a low-k material including deuterium (D), wherein the dielectric layer of the at least one BEOL level further comprising:
         a first section formed from the low-k material including the deuterium (D); and
         a second section formed from a distinct low-k material, the distinct low-k material of the second section includes deuterium (D), and a concentration of the deuterium (D) in the distinct low-k material differing from a concentration of the deuterium (D) in the low-k material forming the first section;
      an etch stop layer disposed over the dielectric layer; and
      at least one conductive structure disposed within the dielectric layer, the at least one conductive structure extending through the dielectric layer and the etch stop layer, respectively.

2. The semiconducting device of claim 1, wherein the low-k material is a carbon doped oxide dielectric material including silicon (Si), carbon (C), oxygen (O), and deuterium (D).

3. The semiconducting device of claim 1, wherein the low-k material is a carbon doped oxide dielectric material including silicon (Si), carbon (C), oxygen (O), hydrogen (H), and 20 deuterium (D).

4. The semiconducting device of claim 3, wherein the hydrogen (H) to deuterium (D) ratio is between approximately 1% hydrogen (H) to 99% deuterium (D) to approximately 90% hydrogen (H) to 10% deuterium.

5. The semiconducting device of claim 4, wherein the hydrogen (H) to deuterium (D) ratio is approximately 50% hydrogen (H) to 50% deuterium (D).

6. The semiconducting device of claim 1, wherein the at least one conductive structure in the at least one BEOL level includes:
   a first conductive structure disposed within and extend through the dielectric layer ; and
   a second conductive structure disposed within and extend through the dielectric layer, the second conductive structure positioned adjacent to and spaced from the first conductive structure.

7. The semiconducting device of claim 6, wherein the first section of the dielectric layer formed from the low-k material including deuterium (D) is disposed between the first conductive structure and the second conductive structure.

8. The semiconducting device of claim 6, wherein the second section of the dielectric layer formed from the distinct low-k material is disposed between the first conductive structure and the second conductive structure, and
   wherein the first section of the dielectric layer formed from the low-k material including deuterium (D) is disposed adjacent the first conductive structure and opposite the second section of the dielectric layer.

9. The semiconducting device of claim 8, wherein the dielectric layer of the at least one BEOL level further comprises:
   a third section formed from the low-k material including the deuterium (D), the third section of the dielectric layer disposed adjacent the second conductive structure and opposite the second section of the dielectric layer.

10. The semiconducting device of claim 1, wherein the at least one BEOL level includes:
    a first BEOL level formed directly adjacent the FEOL portion, the first BEOL level having a first dielectric layer; and
    a second BEOL level formed directly over the first BEOL level, the second BEOL level having a second dielectric layer.

11. The semiconducting device of claim 10, wherein at least one of the first dielectric layer of the first BEOL level or the second dielectric layer of the second BEOL level is formed from the low-k material including deuterium (D).

12. The semiconducting device of claim 10, wherein the at least one BEOL level further includes:
    a third BEOL level formed directly over the second BEOL level, the third BEOL level having a third dielectric layer, and wherein at least one of the first dielectric layer of the first BEOL level, the second dielectric layer of the second BEOL level, or the third dielectric layer of the third BEOL level is formed from the low-k material including deuterium (D).

13. A back end of line (BEOL) portion of a semiconducting device electrically coupled to a front end of line (FEOL) portion of the semiconducting device, the BEOL portion comprising:
    a first BEOL level including:
       a first dielectric layer,
       a first etch stop layer disposed over the first dielectric layer, and
       a plurality of first conductive structures disposed within the first dielectric layer, the plurality of first conductive structures extending through the first dielectric layer and the first etch stop layer, respectively; and
    a second BEOL level formed directly over the first BEOL level, the second BEOL level including:
       a second dielectric layer,
       a second etch stop layer disposed over the second dielectric layer, and
       a plurality of second conductive structures disposed within the second dielectric layer, the plurality of second conductive structures extending through the second dielectric layer and the second etch stop layer, respectively, wherein at least one of the first dielectric layer of the first BEOL level or the second dielectric layer of the second BEOL level further comprising:
- a first section formed from the low-k material including deuterium (D); and
- a second section formed from a distinct low-k material, the distinct low-k material of the second section including deuterium (D) and a concentration of the deuterium (D) in the distinct low-k material of the second section differing from a concentration of the deuterium (D) in the low-k material forming the first section.

14. The BEOL portion of claim 13, wherein the low-k material is a carbon doped oxide dielectric material including silicon (Si), carbon (C), oxygen (O), and deuterium (D).

15. The BEOL portion of claim 13, wherein the low-k material is a carbon doped oxide 5 dielectric material including silicon (Si), carbon (C), oxygen (O), hydrogen (H), and deuterium (D).

16. The BEOL portion of claim 13, further comprising:
a third BEOL level formed directly over the second BEOL level, the third BEOL level including:
- a third dielectric layer;
- a third etch stop layer disposed over the third dielectric layer; and
- a plurality of third conductive structures disposed within the third dielectric layer, the plurality of third conductive structures extending through the third dielectric layer and the third etch stop layer, respectively, wherein at least one of the first dielectric layer of the first BEOL level, the second dielectric layer of the second BEOL level, or the third dielectric layer of the third BEOL level is formed from the low-k material including deuterium (D).

* * * * *